United States Patent
Hendricks et al.

(12)

(10) Patent No.: US 6,823,019 B1
(45) Date of Patent: Nov. 23, 2004

(54) REDUCED DC TRANSIENTS IN A SIGMA DELTA FILTER

(75) Inventors: Paul D. Hendricks, Coopersbrg, PA (US); Donald R. Laturell, Allentown, PA (US); Lane A. Smith, Easton, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/363,005

(22) Filed: Jul. 30, 1999

(51) Int. Cl.[7] .................. H04B 14/06; H03K 5/159
(52) U.S. Cl. .................. 375/247; 375/229; 341/143
(58) Field of Search ................. 375/247, 252, 375/350, 285, 344, 229–235; 708/320, 316, 306, 300, 313; 341/143

(56) References Cited

U.S. PATENT DOCUMENTS 5,175,747 A * 12/1992 Murakami ............... 375/232
5,585,801 A * 12/1996 Thurston ................. 341/143
5,878,086 A * 3/1999 Hulyalkar ................ 375/285
6,157,330 A * 12/2000 Bruekers et al. ......... 341/143
6,232,900 B1 * 5/2001 Hendricks et al. ....... 341/143

\* cited by examiner

*Primary Examiner*—Tesfaldet Bocure

(57) ABSTRACT

DC transients are removed from a digital filter such as a sigma delta filter (in particular from a sigma delta high pass filter) from the outset by presetting an input summing node to a sigma delta modulator. While the input summing node may be preset using any appropriate input, in a disclosed embodiment, a sigma delta high pass filter is preset by switching a partial feedback term between an input containing the non-zero preset value and the normal input comprising the output from the input summing node. The preset value is chosen based on the value of the zero of the transfer function of the sigma delta high pass filter, e.g., with the complement of the gain factor.

16 Claims, 3 Drawing Sheets

REDUCED DC TRANSIENTS IN A SIGMA DELTA FILTER

BACKGROUND OF THE INVENTION

1. Field of the Invention

This invention relates to the digital filtering of an oversampled single bit data stream input. More particularly, it relates to an architecture for an improved sigma delta filter which performs a filtering function on a oversampled single bit stream input without DC transients.

2. Background of Related Art

Digital filters such as Infinite Impulse Response (IIR) filters have been implemented with sigma delta architectures operating at an oversampled rate. For instance, first order filter sections can be implemented with a denominator coefficient multiplying the single bit output from a sigma delta modulator in a feedback loop, and with a numerator coefficient multiplying the single bit input to the sigma delta modulator in a feedforward loop. In this configuration, both the feedback loop and the feedforward loop are added at an input summing node of the sigma delta modulator.

Further enhancements have been achieved to reduce noise. For instance, reduced noise has been achieved by passing only one minus the difference of the desired feedback coefficient through the sigma delta modulator.

Coefficients can be chosen to implement either high pass or low pass responses. In the case of a high pass filter response, an undesired effect of a decaying DC term in the signal spectrum is caused when both the pole and zero are close to the unit circle. In such a case, a less than desirable solution is to wait a sufficiently long enough period of time for the DC transient to die out. If the output signal were to be interpreted by a receiving device (e.g., at a telephone company from a customer premises device employing such an IIR filter), a wrong signal may be interpreted.

FIG. 3 shows the details of a conventional first order single bit filter 190.

In particular, in FIG. 3, a summing node 110 receives and sums an input to the sigma delta filter from gain module 100, a delayed feedforward term from coefficient module 104, and a feedback term output from a sigma delta modulator 120.

The "G times" portion of the numerator of the transfer function of the sigma delta filter 190 is formed with a gain module 100, and the "1 minus" portion of the numerator of the transfer function of the sigma delta filter 190 is formed by a register value output from the feed forward term output from the $a_0$ coefficient module 104. The register value output from the feed forward term coefficient module 104 is either added or subtracted at the input summing node 110, depending upon the delayed (i.e., n−1) value of the single bit sample input to the sigma delta filter 190. The $a_0$ coefficient module 104 is typically implemented using a simple adder/subtractor.

The "1" portion of the denominator of the transfer function of the sigma delta filter 190 is provided with the feedback to the summing node 110 directly from the sigma delta modulator 120 (through factor module 112). The "$b_0 \times z^{-1}$" portion of the denominator of the transfer function of the sigma delta filter 190 is formed by the feedback paths.

Only a portion of the feedback coefficients are passed through the sigma delta modulator 120, the remaining portion being passed through the delay term 116. In FIG. 3, the sigma delta modulator 120 is a second order modulator designed with a delay of $z^{-1}$.

For the $z^{-1}$ term in the denominator, the output of the single bit sigma delta modulator 120 is multiplied by $(1-b_0)$ in the factor module 112, and subtracted at one input to the summing node 110. Multiplication in the factor module 112 is performed, e.g., by simply adding or subtracting register values which contain the partial feedback coefficients $(1-b_0)$. The remaining portion of the denominator coefficients, $z^{-1}$, is fed back and added at the first input to the summing node 110 prior to going through the sigma delta modulator 120.

The output from the delay term 116 is added at a second input to the summing node 110. The output of the $a_0$ feed forward coefficient module 104 is subtracted at a third input to the summing node 110, and the gained input to the sigma delta filter 190 output from the gain module 100 is added at a fourth input to the summing node 110.

In order for a highpass filter configuration to be implemented, the numerator coefficient $a_0$ must be greater than the denominator coefficient $b_0$. However, when the denominator coefficient $b_0$ is very close to 1, the term $(1-b_0)$ fedback through the sigma delta modulator 120 through the factor module 112 becomes very small. Consequently, with this small feedback value, the sigma delta modulator 120 takes a finite period of time to again reach steady state, with this delay manifesting itself as a decaying DC component. This decaying DC component forms a DC transient signal in the sigma delta filter 190. Unfortunately, the DC transient signal causes a significant delay until the output of the sigma delta filter becomes accurate. Thus, a DC transient signal in a filter is highly undesirable, particularly for a high pass filter.

There is thus a need for a digital filter architecture which is capable of overcoming the significant delays caused by DC transients in a digital filter, particularly in a sigma delta filter.

SUMMARY OF THE INVENTION

In accordance with the principles of the present invention, a digital filter comprises a summing node including at least one feedback input, and a feedback term. A mechanism switches between two sources of the feedback term. A first of the two sources is an output of the summing node, and a second of the two sources is a non-zero preset value.

A method of providing a digital data stream to a digital filter in accordance with another aspect of the present invention comprises providing a non-zero preset value as a temporary input to a feedback term. An output of the feedback term is summed in an input summing node to a digital filter. An output of the summing node is provided to the input to the feedback term.

BRIEF DESCRIPTION OF THE DRAWINGS

Features and advantages of the present invention will become apparent to those skilled in the art from the following description with reference to the drawings, in which.

DETAILED DESCRIPTION OF ILLUSTRATIVE EMBODIMENTS

The present invention provides a method and apparatus to reduce and even eliminate DC transients in a digital filter, particularly in a sigma delta filter, and most particularly in a highpass single bit oversampled sigma delta filter by presetting a state variable. In particular, the present invention presets the initial value of a feedback and feedforward summing node of a digital filter when initially started such that DC transients are reduced greatly, or even eliminated entirely. In accordance with the principles of the present invention, a summing node with an initial preset value can have significantly reduced settling times, e.g., from the conventional condition in a range of tens of milliseconds, to an improved range in the microseconds.

To eliminate this undesirable DC component, the present invention provides that the value of the input summing node be preset, preferably to a value corresponding to the complement of the numerator coefficient $a_0$.

Figure 1:
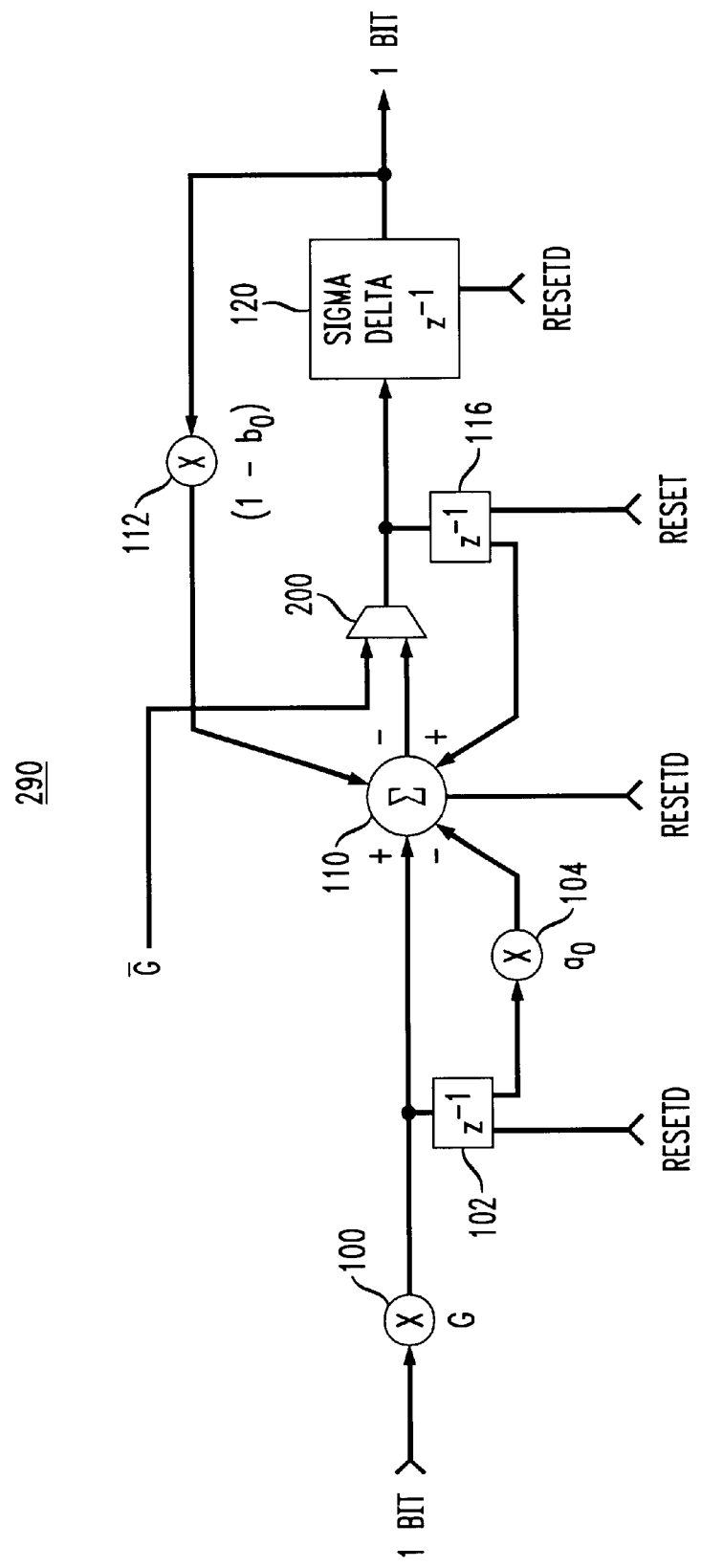
FIG. 1 shows an exemplary embodiment wherein a summing node of a sigma delta filter is preset, e.g., to the complement of the gain value of the filter to reduce or eliminate the occurrence of a DC transient, in accordance with the principles of the present invention.

FIG. 1 shows an exemplary embodiment wherein a summing node of a sigma delta filter is preset, e.g., to the complement of the gain value of the filter to reduce or eliminate the occurrence of a DC transient, in accordance with the principles of the present invention.

Figure 3:
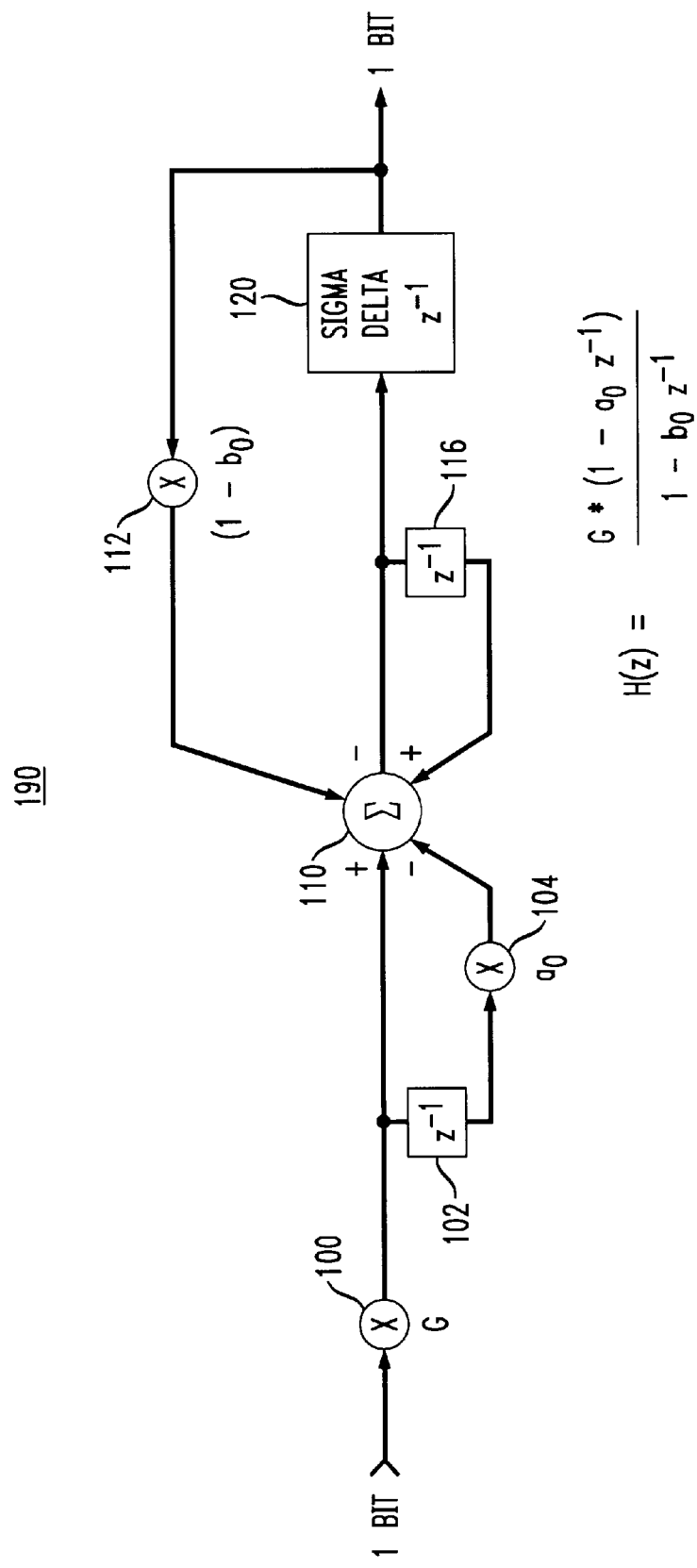
FIG. 3 shows details of a conventional first order single bit filter.

In particular, in FIG. 1, the sigma delta filter 290 includes the same components as shown in the conventional sigma delta filter 190 shown in FIG. 3, but for the important inclusion of a mechanism, e.g., a multiplexer (MUX) 200.

In accordance with the principles of the present invention, the input summing node 110 is preset with a non-zero value using the MUX 200. Thus, when the digital filter is initially started, e.g., when it comes out of a reset condition, a preset value other than zero will be input to the input summing node.

The numerator coefficient $a_0$ is a constant which establishes the value of the digital filter, e.g., the high pass value. In accordance with the principles of the present invention, if the digital filter equation (i.e., transfer function of the signal filter) is such that the zero of the transfer function of the digital filter lies on the unit circle (i.e., $a_0=1$), then the preset value would simply be the negative full scale value of the numerator coefficient $a_0$ (e.g., $/a_0=-1$).

In cases where the zero is placed on the unit circle, the numerator is often scaled by a gain factor G, as indicated by the gain module 100. In this case, the preset value for the input summing node 110 is simply the negative full scale value of the numerator coefficient $a_0$ scaled by the gain factor G.

More generally, the preset value is equal to $-G*a_0$.

In the disclosed embodiment, the desired preset value is set by simply presetting the relevant node (e.g., the feedback node including the coefficient module $b_0$) when the register containing the $a_0$ coefficient is written. Alternatively, the desired preset value can be set by presetting the relevant node when the gain coefficient is written. In any event, in accordance with the principles of the present invention, it is desired that the input summing node 110 be preset to a non-zero value upon start-up.

Figure 2:
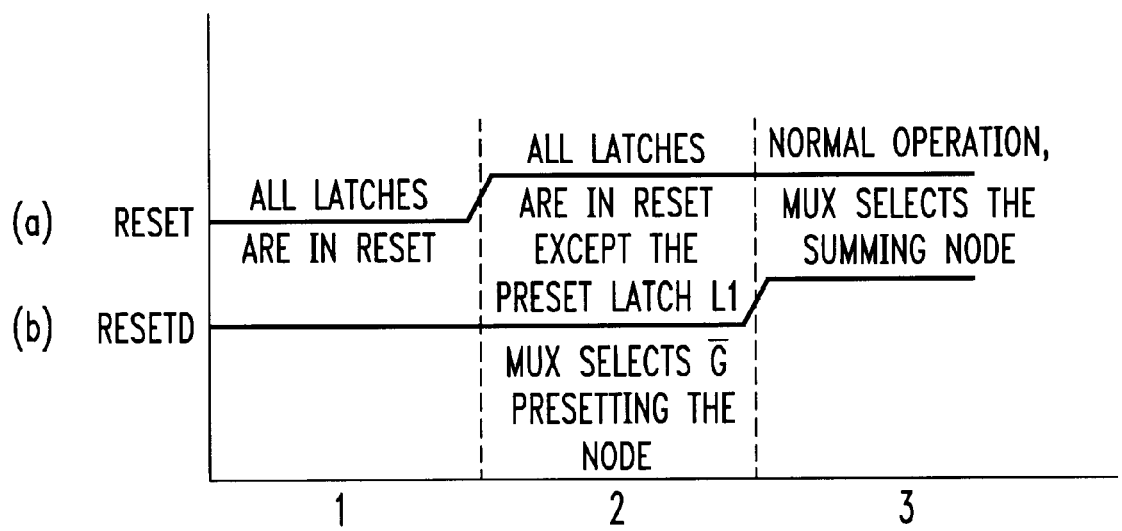
FIG. 2 is a timing diagram useful for explaining the preset of the summing node shown in FIG. 1.

FIG. 2 is a timing diagram useful for explaining the preset of the summing node shown in FIG. 1.

Waveform (a) of FIG. 2 shows a general reset signal RESETD to the digital filter 290, whereas waveform (b) of FIG. 2 depicts a separate reset signal RESET to the preset latch 116.

Initially, during cycle 1 shown in FIG. 2, all relevant digital elements of the digital filter 290 are reset using both the general reset signal RESETD and the preset latch reset signal RESET.

During cycle 2 shown in FIG. 2, all relevant digital elements of the digital filter 290 remain in a reset condition but for the preset latch, which begins operation as the preset latch reset signal RESET becomes non-active. At the same time, during cycle 2, the mechanism, e.g., MUX 200 switches to allow the preset value /G (i.e., the complement of the gain factor G) maintained, e.g., in a register, to be input to the preset latch 116. Thus, the input summing node 110 becomes preset by the preset latch 116 with the preset value /G.

In cycle 3 shown in FIG. 2, the remaining memory elements in the digital filter 290 are brought out of reset, the MUX 200 selects the output of the input summing node 110 to be the source for the feedback loop including the preset latch 116 and the input to the sigma delta modulator 120, and normal operation of the digital filter 290 begins as all relevant digital elements are released from their reset condition.

Accordingly, DC transients are removed from a digital filter such as a sigma delta filter from the outset by presetting an input summing node to a sigma delta modulator. In the disclosed embodiment, a sigma delta high pass filter such as that shown in FIG. 1 is preset with a value chosen based on the value of the zero of the transfer function of the sigma delta high pass filter, e.g., with the complement /G of the gain factor.

While the invention has been described with reference to the exemplary embodiments thereof, those skilled in the art will be able to make various modifications to the described embodiments of the invention without departing from the true spirit and scope of the invention.

What is claimed is:

1. A digital filter, comprising:
   a summing node including at least one feedback input;
   a feedback term; and
   a mechanism to switch between two sources of said feedback term, a first of said two sources being an output of said summing node, and a second of said two sources being a non-zero preset value;

wherein said non-zero preset value is related to a zero of said digital filter.

2. The digital filter according to claim 1, wherein:

said gain function is provided between an input to said digital filter and a positive input to said summing node.

3. The digital filter according to claim 1, wherein said mechanism comprises: s multiplexer.

4. A digital filter, comprising:

a summing node including at least one feedback input;

a feedback term; and a mechanism to switch between two sources of said feedback term, a first of said two sources being an output of said summing node, and a second of said two sources being a non-zero preset value;

wherein said non-zero preset value is a complement to a gain function based on a zero of said digital filter.

5. A digital filter, comprising:

a summing node including at least one feedback input and at least one feedforward summing node;

a feedback term; and a mechanism to switch between two sources of said feedback term, a first of said two sources being an output of said summing node, and a second of said two sources being a non-zero preset value, said non-zero preset value is input to said summing node during an initialization of said digital filter;

wherein said digital filter is a sigma delta filter.

6. A digital filter, comprising:

a summing node including at least one feedback input and at least one feedforward summing node;

a feedback term; and a mechanism to switch between two sources of said feedback term, a first of said two sources being an output of said summing node, and a second of said two sources being a non-zero preset value, said non-zero preset value is input to said summing node during an initialization of said digital filter;

said digital filter being an infinite impulse response high pass sigma delta filter.

7. A digital filter, comprising:

a summing node including at least one feedback input;

a feedback term; and a mechanism to switch between two sources of said feedback term, a first of said two sources being an output of said summing node, and a second of said two sources being a non-zero preset value, said non-zero preset value is input to said summing node during an initialization of said digital filter, said mechanism comprising a switch;

wherein said non-zero preset value is related to a zero of said digital filter.

8. A digital filter, comprising:

a summing node including at least one feedback input;

a feedback term;

a mechanism to switch between two sources of said feedback term, a first of said two sources being an output of said summing node, and a second of said two sources being a non-zero preset value; and a sigma delta modulator connected to an output of said mechanism;

wherein said non-zero preset value is related to a zero of said digital filter.

9. A method of providing a digital data stream to a digital filter, comprising:

providing a non-zero preset value as a temporary input to a feedback term, said non-zero preset value being related to a zero of said digital filter;

summing an output of said feedback term in an input summing node to a digital filter;

providing an output of said summing node to said input to said feedback term; and summing a feedforward term in said input summing node to said digital filter;

wherein said non-zero preset value is provided at an initialization of said digital filter.

10. A method of providing a digital data stream to a digital filter, comprising:

providing a non-zero preset value as a temporary input to a feedback term;

summing an output of said feedback term in an input summing node to a digital filter;

providing an output of said summing node to said input to said feedback term; and summing a feedforward term in said input summing node to said digital filter;

wherein said non-zero preset value is provided at an initialization of said digital filter; and wherein said digital filter is a sigma delta filter.

11. A method of providing a digital data stream to a digital filter, comprising:

providing a non-zero preset value as a temporary input to a feedback term;

summing an output of said feedback term in an input summing node to a digital filter; and providing an output of said summing node to said input to said feedback term;

wherein said non-zero preset value is related to a zero of said digital filter; and wherein said digital filter is a highpass sigma delta filter.

12. A method of providing a digital data stream to a digital filter, comprising:

providing a non-zero preset value as a temporary input to a feedback term;

summing an output of said feedback term in an input summing node to a digital filter;

providing an output of said summing node to said input to said feedback term; and summing a feedforward term in said input summing node to said digital filter;

wherein said non-zero preset value is provided at an initialization of said digital filter; and wherein said digital sample stream is comprised of 1-bit digital samples.

13. Apparatus for providing a digital data stream to a digital filter, comprising:

means for providing a non-zero preset value as a temporary input to a feedback term;

means for summing an output of said feedback term in an input summing node to a digital filter;

means for providing an output of said summing node to said input to said feedback term, and for providing said non-zero preset value at an initialization of said digital filter, said non-zero preset value being related to a zero of said digital filter; and means for summing a feedforward term in said input summing node to said digital filter.

14. An apparatus for providing a digital data stream to a digital filter, comprising:

means for providing a non-zero preset value as a temporary input to a feedback term;

means for summing an output of said feedback term in an input summing node to a digital filter;

means for providing an output of said summing node to said input to said feedback term, and for providing said non-zero preset value at an initialization of said digital filter; and means for summing a feedforward term in said input summing node to said digital filter;

wherein said digital filter is a sigma delta filter.

15. Apparatus for providing a digital data stream to a digital filter, comprising:

means for providing a non-zero preset value as a temporary input to a feedback term, said non-zero preset value being related to a zero of said digital filter;

means for summing an output of said feedback term in an input summing node to a digital filter; and means for providing an output of said summing node to said input to said feedback term;

wherein said digital filter is a highpass sigma delta filter.

16. An apparatus for providing a digital data stream to a digital filter, comprising:

means for providing a non-zero preset value as a temporary input to a feedback term;

means for summing an output of said feedback term in an input summing node to a digital filter;

means for providing an output of said summing node to said input to said feedback term, and for providing said non-zero preset value at an initialization of said digital filter; and means for summing a feedforward term in said input summing node to said digital filter;

wherein said digital sample stream is comprised of 1-bit digital samples.

* * * * *